(12) United States Patent
Coley et al.

(10) Patent No.: US 6,765,516 B1
(45) Date of Patent: Jul. 20, 2004

(54) METHOD AND APPARATUS FOR ROOT-MEAN-SQUARE CONVERTER OUTPUT SIGNAL PROCESSING

(75) Inventors: William H. Coley, Longmont, CO (US); Ronald L. Swerlein, Longmont, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/684,098

(22) Filed: Oct. 10, 2003

(51) Int. Cl.[7] .................................................. H03M 1/00
(52) U.S. Cl. ....................................... 341/126; 327/348
(58) Field of Search ............................... 341/126, 155, 341/156, 162, 161; 327/348, 354

(56) References Cited

U.S. PATENT DOCUMENTS

| | | | | |
|---|---|---|---|---|
| 5,508,607 A | * | 4/1996 | Gibson | .................... 324/121 R |
| 5,933,013 A | * | 8/1999 | Kimura | ........................ 324/601 |
| 6,501,329 B1 | * | 12/2002 | Petrofsky et al. | ........... 327/552 |

* cited by examiner

*Primary Examiner*—Brian Young
*Assistant Examiner*—John B. Nguyen

(57) ABSTRACT

An apparatus and method for signal processing in a root-mean-square (RMS) meter. In representative embodiments, the root-mean-square (RMS) meter includes an RMS converter having a converter input and a converter output. The RMS converter converts a time varying signal applied to the converter input to a signal at the converter output. The value of the signal at the converter output is indicative of the RMS value of the applied signal. The signal at the converter output comprises a non-time varying component and a time varying component as determined by a time constant of the RMS converter. The RMS meter further includes an inverting amplifier having an inverter input and an inverter output. The converter output is connected to the inverter input. In addition, the RMS meter includes a switch having first, second, and central contacts. The converter output is connected to the first contact, and the inverter output is connected to the second contact. When the switch is in a first position, the first contact is connected to the central contact, and when the switch is in a second position, the second contact is connected to the central contact.

18 Claims, 10 Drawing Sheets

METHOD AND APPARATUS FOR ROOT-MEAN-SQUARE CONVERTER OUTPUT SIGNAL PROCESSING

BACKGROUND

A common means of specifying a value for a time varying signal, often referred to as an alternating current (AC) signal, whether the signal is in the form of a time varying voltage or in the form of a time varying current, is to use the root-mean-square (RMS) value of that signal. Less expensive AC meters, used to measure RMS values, often employ a technique wherein the meter responds to the average of the rectified signal but applies a scale factor in order to obtain an indication of the root-mean-square (RMS) value of the AC signal it is detecting. Such an "average responding" meter gives a correct value for the RMS voltage of a signal only for a sinusoidal signal of a single frequency which is free of significant distortion. These conditions are often not met which results in an incorrect RMS value indicated for the signal.

More accurate and more expensive AC meters used for measuring the RMS value of a signal employ an RMS converter. In the RMS converter, analogue circuitry first rectifies the time varying signal and then squares the resultant rectified values. Finally additional analogue circuitry in the RMS converter is used to average the squared values to obtain the RMS value of the signal. This resultant RMS value is the output signal of the RMS converter and will typically comprise a large direct current (DC) signal component and a smaller AC component. The value of the AC component, referred to as a ripple component, is controlled by the interaction of repetitive and non-repetitive components of the input signal, as well as the time constant of the RMS converter. Typically the output of the RMS converter is allowed to track the input at low input frequencies. The output of the RMS converter may be digitized by an analog-to-digital converter (A/D converter) at a rate high enough to capture any significant ripple coming out of the RMS converter. The output of the A/D converter can be fed into additional RMS computational circuitry which can be implemented digitally by a microprocessor.

SUMMARY

In representative embodiments, a root-mean-square (RMS) meter includes an RMS converter having a converter input and a converter output. The RMS converter converts a time varying signal applied to the converter input to a signal at the converter output. The value of the signal at the converter output is indicative of the RMS value of the applied signal. The signal at the converter output comprises a non-time varying component and a time varying component as determined by a time constant of the RMS converter. The RMS meter further includes an inverting amplifier having an inverter input and an inverter output. The converter output is connected to the inverter input. In addition, the RMS meter includes a switch having first, second, and central contacts. The converter output is connected to the first contact, and the inverter output is connected to the second contact. When the switch is in a first position, the first contact is connected to the central contact, and when the switch is in a second position, the second contact is connected to the central contact.

A representative method for processing an input signal includes obtaining a root-mean-square signal by taking the root-mean-square of the input signal, inverting the root-mean-square signal, and using equal duty cycles, combining the root-mean-square signal and the inverted root-mean-square signal by periodically switching between the two signals.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

DETAILED DESCRIPTION OF THE PREFERRED EMBODIMENTS

Figure 1:
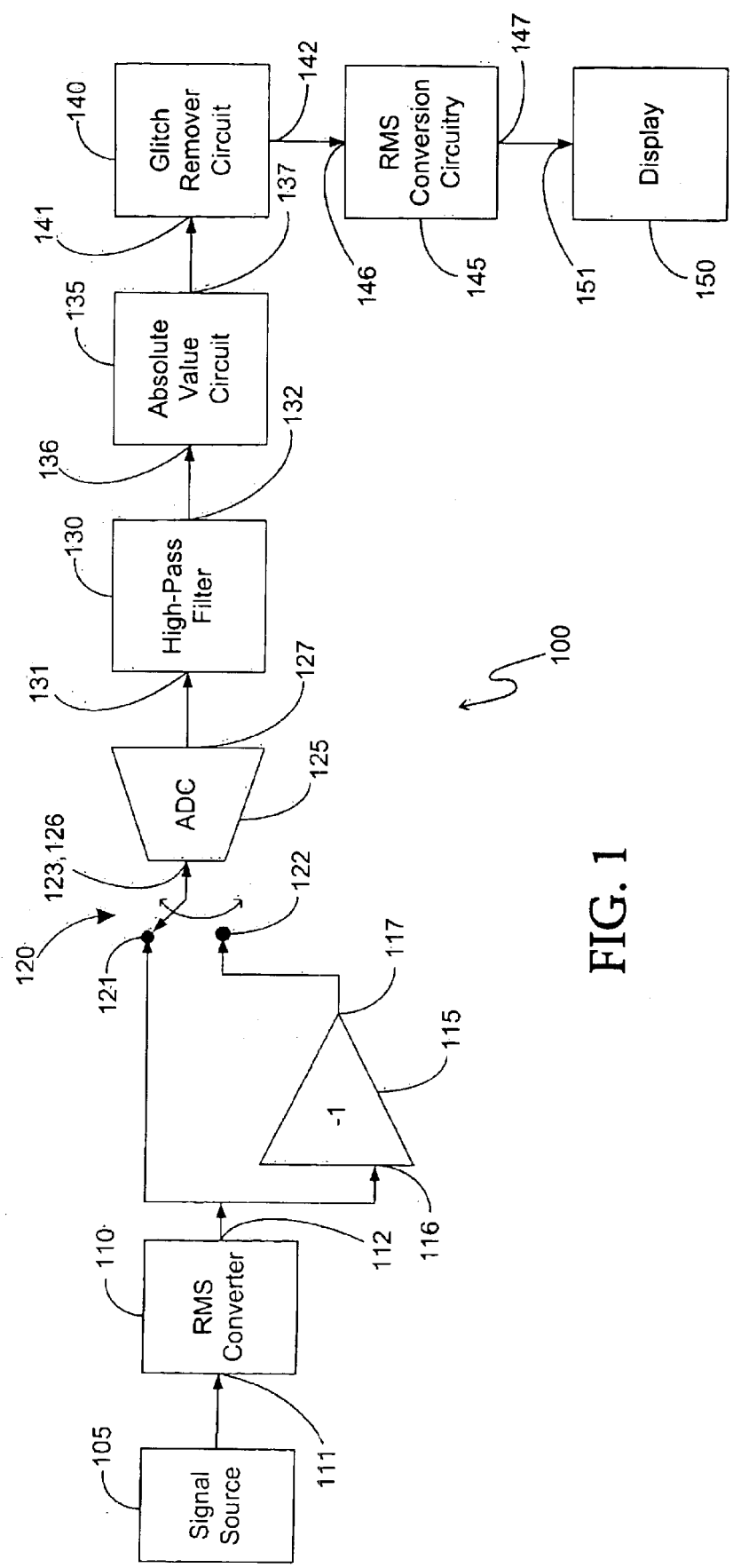
FIG. 1 is a drawing of a root-mean-square meter as described in various representative embodiments consistent with the teachings of the invention.

As shown in the drawings for purposes of illustration, the present patent document relates to a novel method and apparatus for signal processing of the output of a root-mean-square (RMS) converter. Previous techniques have fed the output of an analog RMS converter into an analog-to-digital converter typically for further signal processing. Analog-to-digital converters typically have a drift which has been removed by periodically switching its input to ground and then subtracting the output of the analog-to-digital converter from its output when connected to the output of the RMS converter.

In the following detailed description and in the several figures of the drawings, like elements are identified with like reference numerals.

FIG. 1 is a drawing of a root-mean-square meter 100 as described in various representative embodiments consistent with the teachings of the invention. The root-mean-square meter 100 is also referred to herein as RMS meter 100. In FIG. 1, a signal source 105 is connected to an input 111 of a root-mean-square converter 110, also referred to herein as a RMS converter 110. The input 111 of the RMS converter 110 is also referred to herein as converter input 111. The RMS converter 110 further comprises a converter output 112. In the RMS converter 110, analog circuitry first rectifies the time varying signal and then squares the resultant rectified values. Finally additional analog circuitry in the RMS converter 110 is used to average the squared values to obtain the RMS value of the input signal. This resultant RMS value is the output signal of the RMS converter 110 and will typically comprise a large direct current (DC) signal component and a smaller AC component. The value of the AC component, referred to as a ripple component, is controlled by the interaction of repetitive and non-repetitive components of the input signal, as well as the time constant of the RMS converter 110. Typically the output of the RMS converter 110 is allowed to track the input at low input frequencies. The output of the RMS converter 110 may be digitized by an analog-to-digital converter (A/D converter) at a rate high enough to capture any significant ripple coming out of the RMS converter 110. The output of the A/D converter is fed into additional RMS computational circuitry which can be implemented digitally by a microprocessor as has been disclosed by Ronald L. Swerlein in U.S. Pat. No. 5,117,180 entitled "Method and Apparatus for Measuring RMS Values" which is incorporated herein by reference.

In FIG. 1, the output of the RMS converter 110 at converter output 112 is fed into an inverting amplifier 115 at inverter input 116. The inverting amplifier further comprises inverter output 117. The converter output 112 is connected to a first contact 121 of a switch 120. The switch 120 further comprises a second contact 122 and a central contact 123. Inverting amplifier 115 has a gain of minus one resulting in the signal at second contact 122 having the same magnitude as that of the signal at first contact 121. The signal at second contact 122 has the opposite polarity of that of the signal at first contact 121.

Switch 120 is a single-pole-double-throw switch wherein in a first position the central contact 123 is connected to the first contact 121 and in a second position the central contact 123 is connected to the second contact 122. In a typical implementation switch 120 is a make-after-break switch. Thus, the signal at central contact 123 comprises a signal which periodically switches between that of the output of the RMS converter 110 and the inverse of the output of the RMS converter 110.

The central contact 123 of switch 120 is connected to an analog-to-digital converter (ADC) 125 at an ADC input 126. Analog-to-digital converter 125 further comprises an ADC output 127. The analog-to-digital converter 125 samples the periodically switched signal at its input 126 and then converts that analog signal into a digital signal.

The ADC output 127 is connected to a high-pass filter 130 at a filter input 131. High-pass filter 130 further comprises a filter output 132. High-pass filter 130 filters out the low-frequency components of the signal at filter input 131. This filtered signal is outputted at filter output 132.

The filter output 132 is connected to an absolute value circuit 135 at an absolute value circuit input 136. Absolute value circuit 135 further comprises an absolute value circuit output 137. Absolute value circuit 135 converts the signal at absolute value circuit input 136 to the absolute value of that signal. This absolute value signal is outputted at absolute value circuit output 137.

The absolute value circuit output 137 is connected to a glitch remover circuit 140 at a glitch remover circuit input 141. Glitch remover circuit 140 further comprises a glitch remover circuit output 142. Glitch remover circuit 140 removes glitches introduced into the signal by the switch 120 in its transitions from the first to the second positions. The de-glitched signal is outputted at glitch remover circuit output 142.

The glitch remover circuit output 142 is connected to additional RMS conversion circuitry 145 at a conversion circuitry input 146. Additional RMS conversion circuitry 145 further comprises a conversion circuitry output 147. Additional RMS conversion circuitry 145 performs a second root-mean-square conversion of the signal at the conversion circuitry input 146 typically by digital signal processing. The root-mean-square converted signal is outputted at conversion circuitry output 147.

The conversion circuitry output 147 is connected to a display 150 at a display input 151. The display 150 provides a visual indication to the user of the root-mean-square value of the signal from the signal source 105 at the converter input 111 to the root-mean-square converter 110. The display 150 is typically a digital display using one of any number of available alphanumeric display devices including, but not limited to those fabricated via LCD, LED, and plasma technologies. The display 150 could also comprise a cathode ray tube (CRT) as its means of displaying the output signal.

Figure 2:
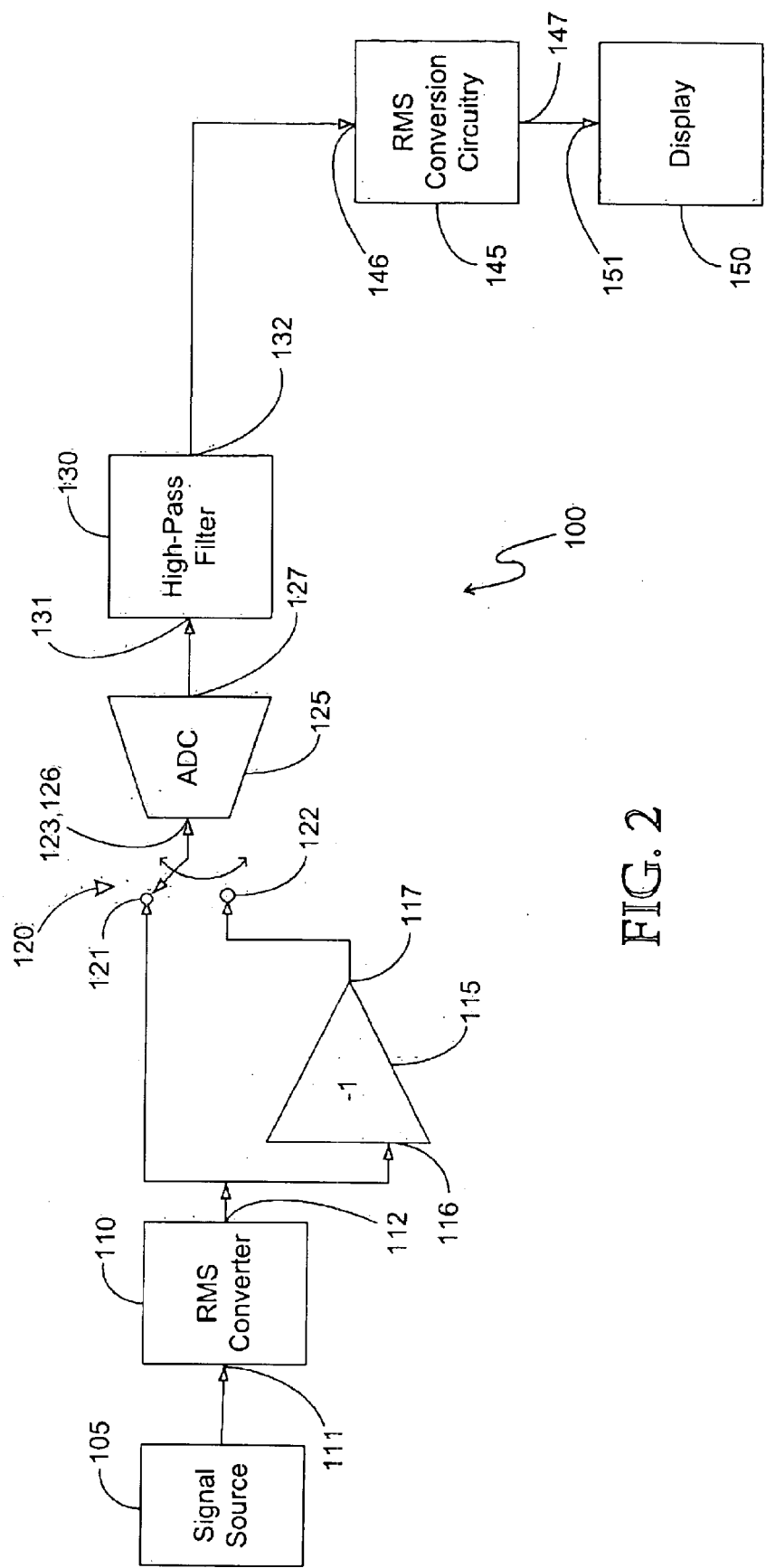
FIG. 2 is a drawing of another root-mean-square meter as described in various representative embodiments consistent with the teachings of the invention.

FIG. 2 is a drawing of another root-mean-square meter 100 as described in various representative embodiments consistent with the teachings of the invention. In FIG. 2, the signal source 105 is connected to the input 111 of the RMS converter 110. The RMS converter 110 further comprises the converter output 112. In the RMS converter 110, analog circuitry first rectifies the time varying signal and then squares the resultant rectified values. Finally additional analog circuitry in the RMS converter 110 is used to average the squared values to obtain the RMS value of the input signal. This resultant RMS value is the output signal of the RMS converter 110 and will typically comprise a large direct current (DC) signal component and a smaller AC component. The value of the AC component, referred to as a ripple component, is controlled by the interaction of repetitive and non-repetitive components of the input signal, as well as the time constant of the RMS converter 110. Typically the output of the RMS converter 110 is allowed to track the input at low input frequencies. The output of the RMS converter 110 may be digitized by an analog-to-digital converter (A/D converter) at a rate high enough to capture any significant ripple coming out of the RMS converter 110. The output of the A/D converter is fed into additional RMS computational circuitry.

In FIG. 2, the output of the RMS converter 110 at converter output 112 is fed into the inverting amplifier 115 at inverter input 116. The inverting amplifier further comprises inverter output 117. The converter output 112 is connected to the first contact 121 of a switch 120. The switch 120 further comprises the second contact 122 and the central contact 123. Inverting amplifier 115 has a gain of minus one resulting in the signal at second contact 122 having the same magnitude as that of the signal at first contact 121. The signal at second contact 122 has the opposite polarity of that of the signal at first contact 121.

Switch 120 is a single-pole-double-throw switch wherein in the first position the central contact 123 is connected to the first contact 121 and in the second position the central contact 123 is connected to the second contact 122. In a typical implementation switch 120 is a make-after-break switch. Thus, the signal at central contact 123 comprises a signal which periodically switches between that of the output of the RMS converter 110 and the inverse of the output of the RMS converter 110.

The central contact 123 of switch 120 is connected to the analog-to-digital converter 125 at the ADC input 126. Analog-to-digital converter 125 further comprises the ADC output 127. The analog-to-digital converter 125 samples the periodically switched signal at its input 126 and then converts that analog signal into a digital signal.

The ADC output 127 is connected to the high-pass filter 130 at the filter input 131. High-pass filter 130 further comprises the filter output 132. High-pass filter 130 filters out the low-frequency components of the signal at filter input 131. This filtered signal is outputted at filter output 132.

The filter output 132 is connected to additional RMS conversion circuitry 145 at the conversion circuitry input 146. Additional RMS conversion circuitry 145 further comprises the conversion circuitry output 147. Additional RMS conversion circuitry 145 performs a second root-mean-square conversion of the signal at the conversion circuitry input 146 typically by digital signal processing. The root-mean-square converted signal is outputted at conversion circuitry output 147.

The conversion circuitry output 147 is connected to the display 150 at the display input 151. The display 150 provides a visual indication to the user of the root-mean-square value of the signal from the signal source 105 at the converter input 111 to the root-mean-square converter 110. Again, the display 150 is typically a digital display using one of any number of available alphanumeric display devices including, but not limited to those fabricated via LCD, LED, and plasma technologies. The display 150 could also comprise a cathode ray tube (CRT) as its means of displaying the output signal.

Figure 3:
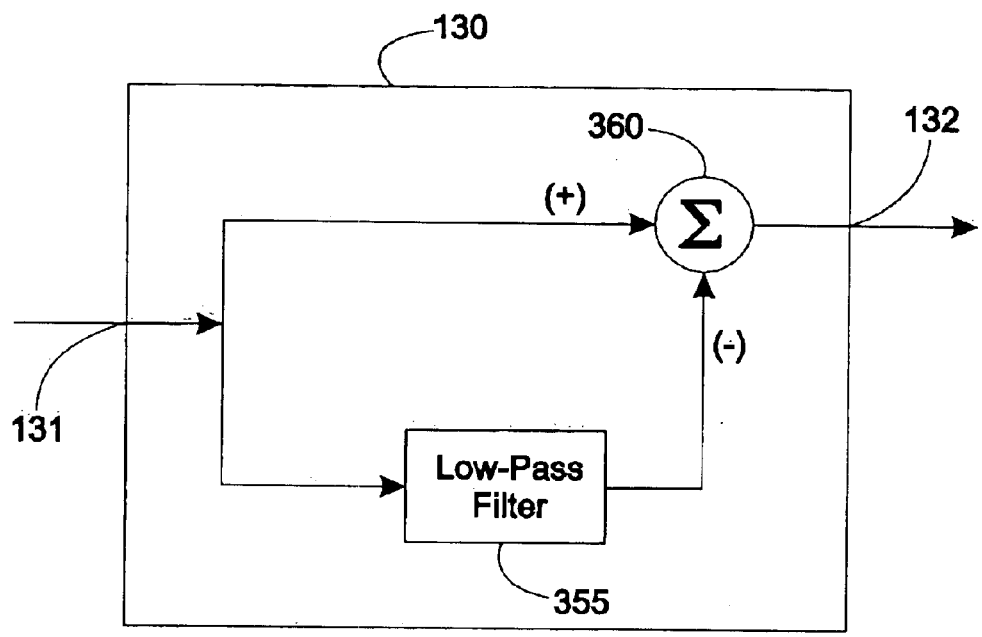
FIG. 3 is a drawing of an implementation of a high-pass filter as described in various representative embodiments.

FIG. 3 is a drawing of an implementation of the high-pass filter 130 as described in various representative embodiments. In FIG. 3, the signal at filter input 131 is fed to a low-pass filter 355 and to a summing circuit 360. The summing circuit 360 adds the signal at filter input 131 to the negative of the output of the low pass filter 355 thereby removing the low frequency components of the signal at filter input 131. The result of this addition is outputted from the high-pass filter at filter output 132.

Figure 4:
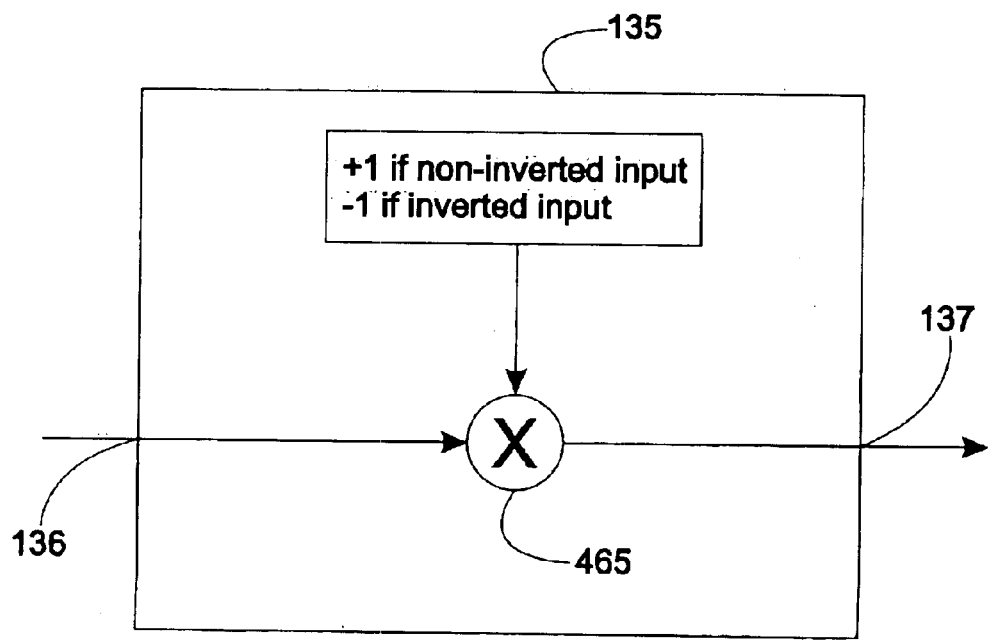
FIG. 4 is a drawing of an implementation of an absolute value circuit as described in various representative embodiments.

FIG. 4 is a drawing of an implementation of the absolute value circuit 135 as described in various representative embodiments. In FIG. 4, the signal at absolute value circuit input 136 is fed to a multiplication circuit 465. The multiplication circuit 465 multiplies the signal at absolute value input 136 by a plus one if the switch 120 is in position one wherein the converter output 112 is connected to the ADC input 126 via the first contact 121 and the central contact 123 of the switch 120. This is the case of the non-inverted signal connected to the ADC input 126. Further, the multiplication circuit 465 multiplies the signal at absolute value input 136 by a negative one if the switch 120 is in position two wherein the inverter output 116 is connected to the ADC input 126 via the second contact 122 and the central contact 123 of the switch 120. This is the case of the inverted signal connected to the ADC input 126.

Figure 5:
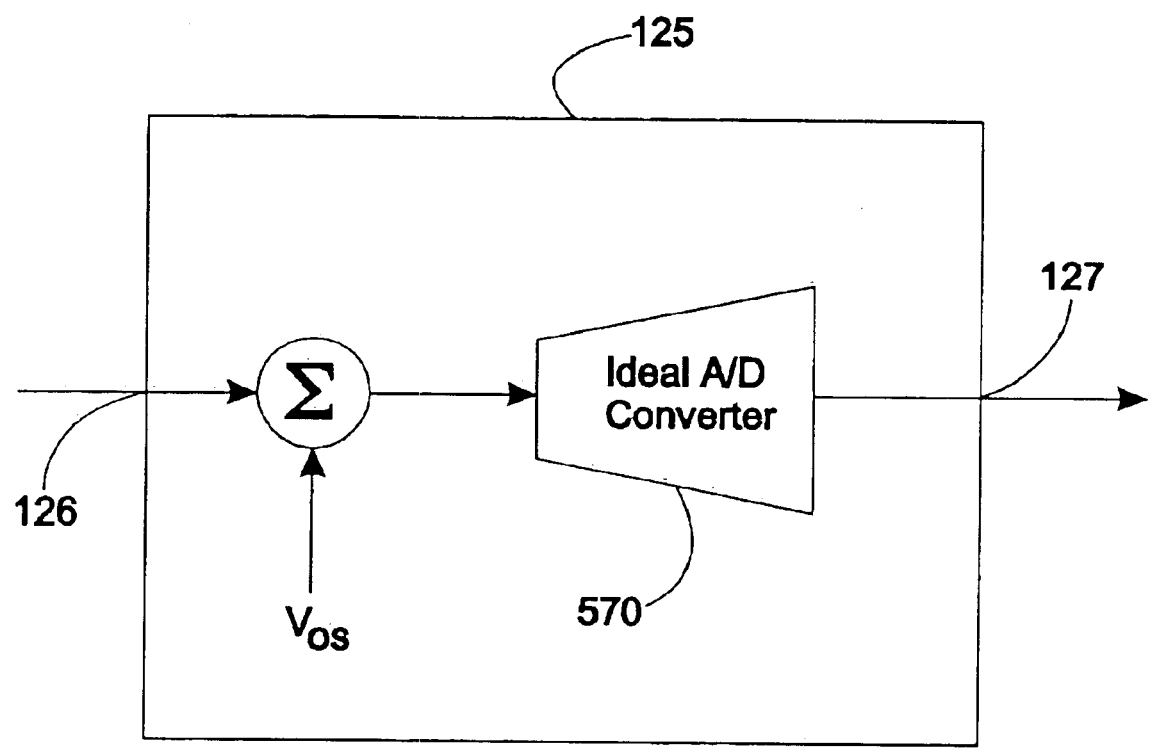
FIG. 5 is a drawing of a representation of an analog-to-digital converter having an unstable offset as described in various representative embodiments.

FIG. 5 is a drawing of a representation of the analog-to-digital converter 125 having an unstable offset as described in various representative embodiments. In the representative embodiment of FIG. 5, an ideal analog-to-digital converter 570, also referred to herein as A/D converter 570, is shown with and unstable offset signal $V_{OS}$ added to the signal inputted to the analog-to-digital converter 125 at ADC input 126. If not compensated for, this unstable offset signal $V_{OS}$ will become an unstable error component in the RMS value obtained and may result in an error or flickering of the displayed RMS value.

The waveforms shown in FIGS. 6A–6I that follow are for illustrative purposes only. In particular, it should be noted that ripple components shown in FIGS. 6D–6H are typically at a much higher frequency than the frequency of switching between the inverting and non-inverting signals.

Figure 6A:
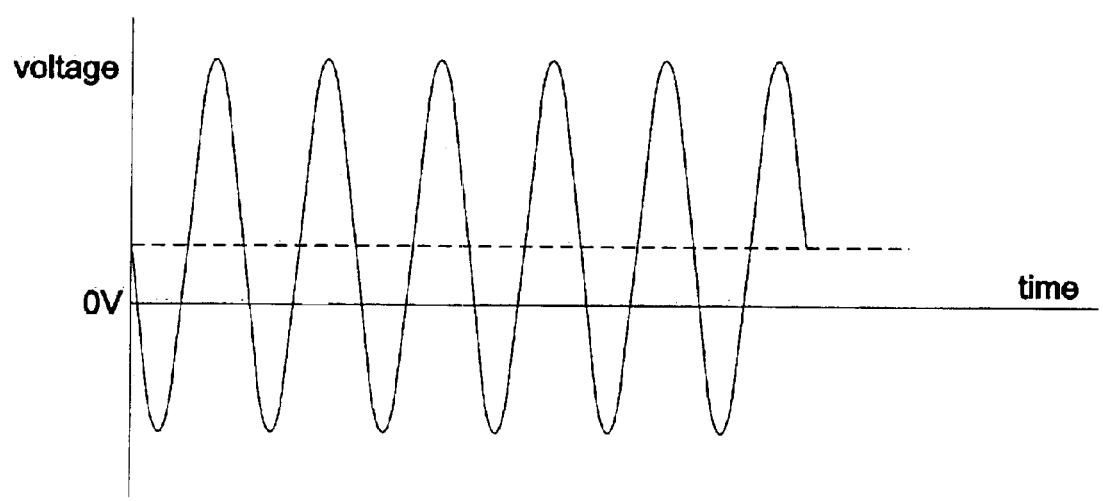
FIG. 6A is a drawing of a wave form of a representative signal at a contact point of the RMS meter as described in various representative embodiments.

FIG. 6A is a drawing of a wave form of a representative signal at a contact point of the RMS meter 100 as described in various representative embodiments. FIG. 6A shows the wave form of the signal at the converter input 111 and is the input signal of which the RMS value is to be obtained by the RMS meter 100. While the wave form shown in FIG. 6A is that of a sine wave with a small direct current (DC) signal component, in representative applications it could be essentially any arbitrary waveform which could or could not comprise a DC signal component. The signal at the converter input 111 can be generally expressed as $V_{111}=(V_{AC\_111}+V_{DC\_111})$ explicitly identifying the AC and DC components of the input signal.

Figure 6B:
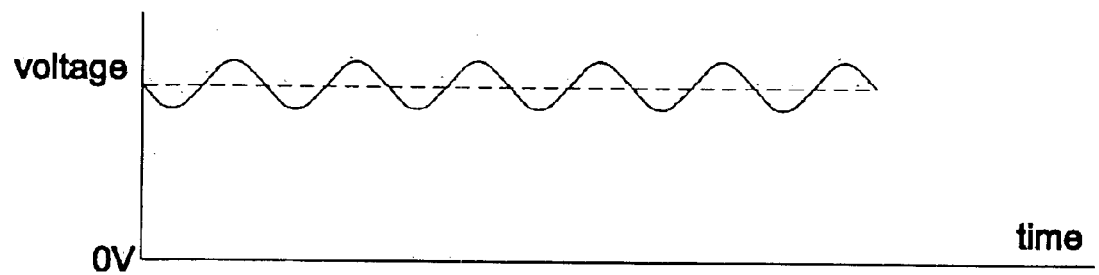
FIG. 6B is a drawing of another wave form of a representative signal at a contact point of the RMS meter as described in various representative embodiments.

FIG. 6B is a drawing of another wave form of a representative signal at a contact point of the RMS meter 100 as described in various representative embodiments. FIG. 6B shows the wave form of the signal at the converter output 112 and is the RMS value plus a ripple signal outputted by the RMS converter 110. The signal at the converter output 112 can be generally expressed as $V_{112}=(V_{AC\_112}+V_{DC\_112})$ explicitly identifying the AC and DC components of the input signal. $V_{112}$ comprises a relatively large DC component with a much smaller AC component (the ripple) wherein the square root of $[(V_{AC\_111})^2+(V_{DC\_111})^2]$ is equal to the square root of $[(V_{AC\_112})^2+(V_{DC\_112})^2]$.

Figure 6C:
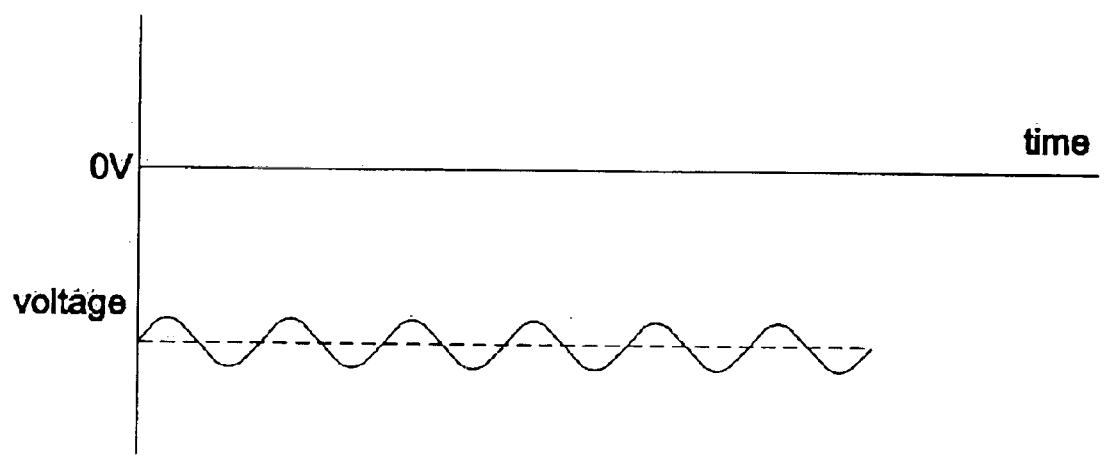
FIG. 6C is a drawing of an additional wave form of a representative signal at a contact point of the RMS meter as described in various representative embodiments consistent with the teachings of the invention.

FIG. 6C is a drawing of an additional wave form of a representative signal at a contact point of the RMS meter 100 as described in various representative embodiments consistent with the teachings of the invention. FIG. 6C shows the wave form of the signal at inverter output 117 and is the inverse of the RMS value plus a ripple signal outputted by the RMS converter 110 at converter output 112. The signal at the inverter output 117 can be generally expressed as $V_{117} = -(V_{AC\_112} + V_{DC\_112})$ explicitly identifying the AC and DC components of the input signal.

Figure 6D:
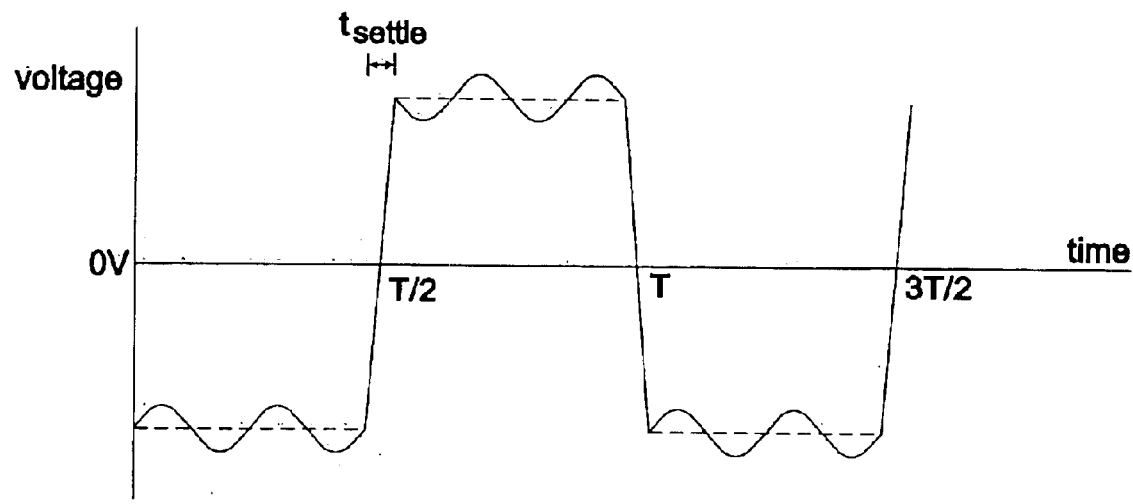
FIG. 6D is a drawing of a further wave form of a representative signal at a contact point of the RMS meter as described in various representative embodiments consistent with the teachings of the invention.

FIG. 6D is a drawing of a further wave form of a representative signal at a contact point of the RMS meter 100 as described in various representative embodiments consistent with the teachings of the invention. FIG. 6D shows the wave form of the signal at the ADC input 126 of the analog-to-digital input converter 125. The signal at the ADC input 126 is the switched combination of the wave form of the signal at the converter output 112 which, as previously stated, is the RMS value plus a ripple signal outputted by the RMS converter 110 and the wave form of the signal at inverter output 117 which, again as previously stated, is the inverse of the RMS value plus a ripple signal outputted by the RMS converter 110 at converter output 12. Switching between the two input signals occurs every T/2 seconds. Effectively the signal of FIG. 6D is the signal at the output of the root-mean-square converter 110 multiplied by a square wave having a peak amplitude of one and period T with some switch settling time which is shown in FIG. 6D as $t_{settle}$. The signal at the input to the analog-to-digital converter 125 can be generally expressed as $V_{116} = (V_{AC\_112} + V_{DC\_112})*sq(t)$ explicitly identifying the AC and DC components of the signal multiplied by a square wave sq(t) again of period T and having a peak amplitude of one.

Figure 6E:
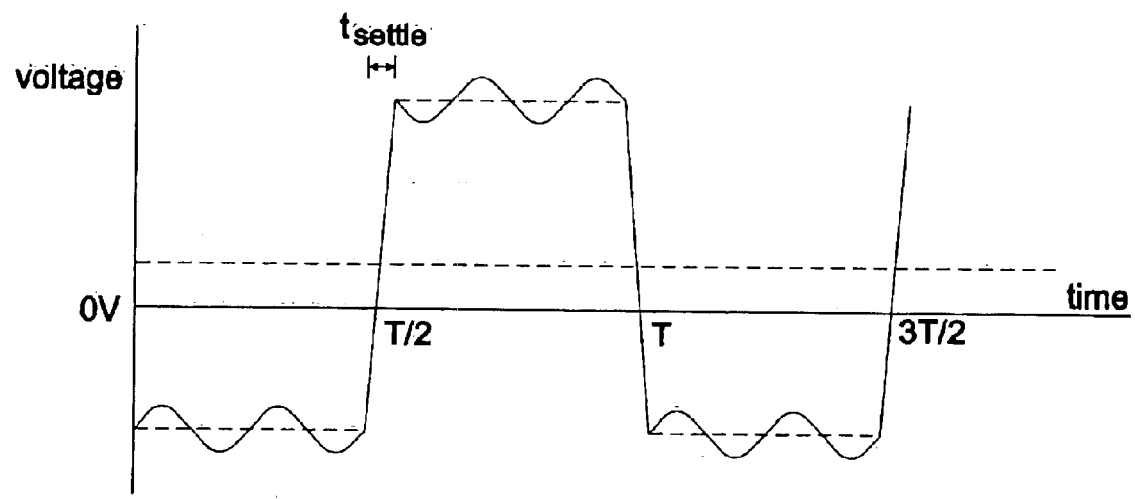
FIG. 6E is a drawing of yet another wave form of a representative signal at a contact point of the RMS meter as described in various representative embodiments consistent with the teachings of the invention.

FIG. 6E is a drawing of yet another wave form of a representative signal at a contact point of the RMS meter 100 as described in various representative embodiments consistent with the teachings of the invention. The wave form shown in FIG. 6E is an analog representation of the digital signal at the output of the analog-to-digital converter 125 which is the analog-to-digital conversion of the signal at the ADC input 126 with the added unstable offset $V_{OS}$ as shown in FIG. 5. Effectively the signal of FIG. 6E is the signal at the output of the root-mean-square converter 110 multiplied by a square wave having a peak amplitude of one and period T with some switch settling time which is shown in FIG. 6E as $t_{settle}$ and which has an added unstable offset $V_{OS}$. The signal at the output of the analog-to-digital converter 125 can be generally expressed as $V_{127} = (V_{AC\_112} + V_{DC\_112})*sq(t) + V_{OS}$ explicitly identifying the AC and DC components of the signal multiplied by a square wave sq(t) again of period T and having a peak amplitude of one plus the unstable offset $V_{OS}$.

Figure 6F:
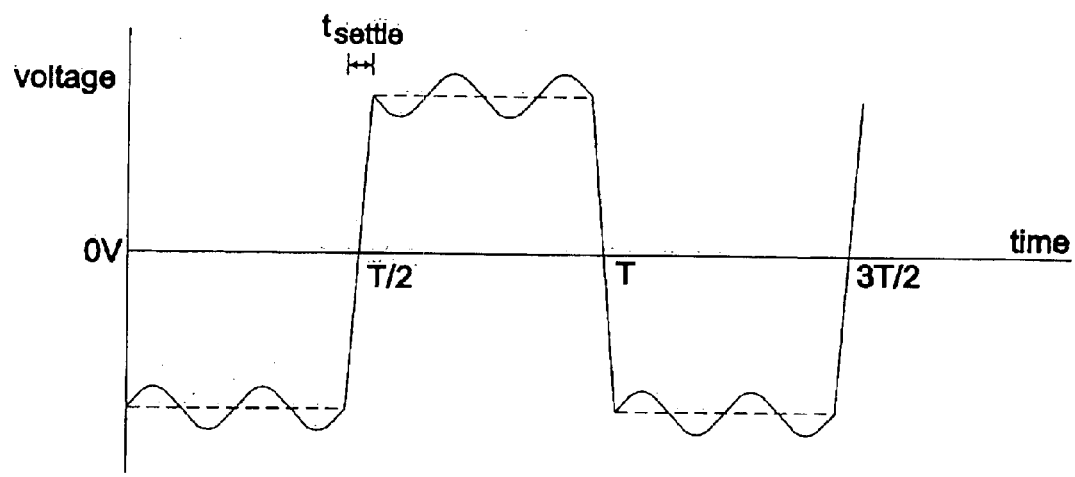
FIG. 6F is a drawing of still another wave form of a representative signal at a contact point of the RMS meter as described in various representative embodiments consistent with the teachings of the invention.

FIG. 6F is a drawing of still another wave form of a representative signal at a contact point of the RMS meter 100 as described in various representative embodiments consistent with the teachings of the invention. The wave form shown in FIG. 6F is an analog representation of the digital signal at the output of the high-pass filter 130 which is the signal at the ADC output 127 after it has been filtered by the high-pass filter 130. Effectively the signal of FIG. 6F is the signal at the output of the root-mean-square converter 110 multiplied by a square wave having a peak amplitude of one and period T with some switch settling time which is shown in FIG. 6F as $t_{settle}$ and which has the added unstable offset $V_{OS}$ filtered out. The signal at the output of the high-pass filter 130 can be generally expressed as $V_{132} = (V_{AC\_112} + V_{DC\_112})*sq(t)$ explicitly identifying the AC and DC components of the signal multiplied by a square wave sq(t) again of period T and having a peak amplitude of one.

Figure 6G:
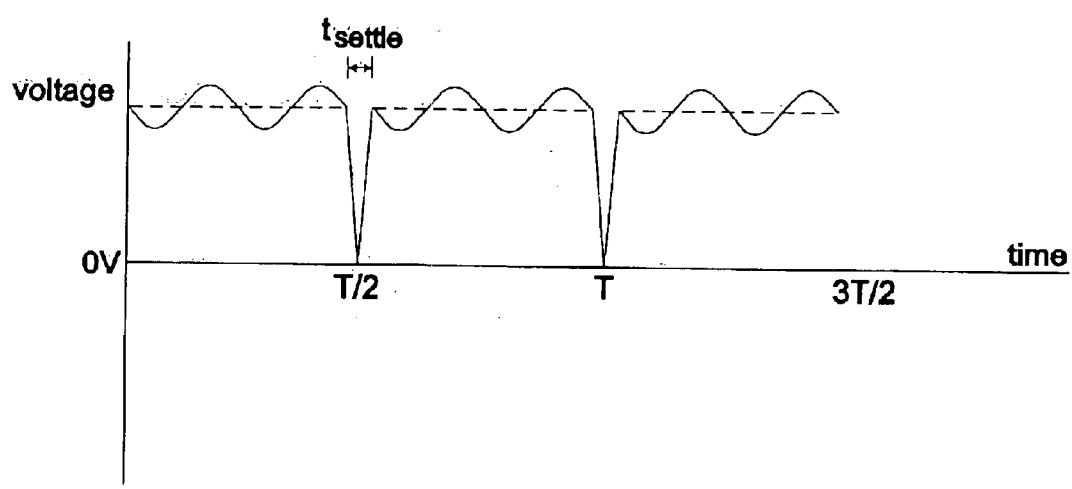
FIG. 6G is a drawing of even another wave form of a representative signal at a contact point of the RMS meter as described in various representative embodiments consistent with the teachings of the invention.

FIG. 6G is a drawing of even another wave form of a representative signal at a contact point of the RMS meter 100 as described in various representative embodiments consistent with the teachings of the invention. The wave form shown in FIG. 6G is an analog representation of the digital signal at the output of the absolute value circuit 135 which is the absolute value of the analog-to-digital conversion of the signal at the absolute value circuit input 136. Effectively the signal of FIG. 6G is the absolute value of the signal at the output of the root-mean-square converter 110 multiplied by a square wave having a peak amplitude of one and period T with some switch settling time which is shown in FIG. 6G as $t_{settle}$. The signal at the output of the absolute value circuit 135 can be generally expressed as $V_{137} = (V_{AC\_112} + V_{DC\_112})*glitch(t)$ explicitly identifying the AC and DC components of the signal multiplied by a time varying glitch function glitch(t). Notice that the finite switching rise and fall times (the settling times) become large AC signals which are represented in the equation for FIG. 6G by the function glitch(t).

Figure 6H:
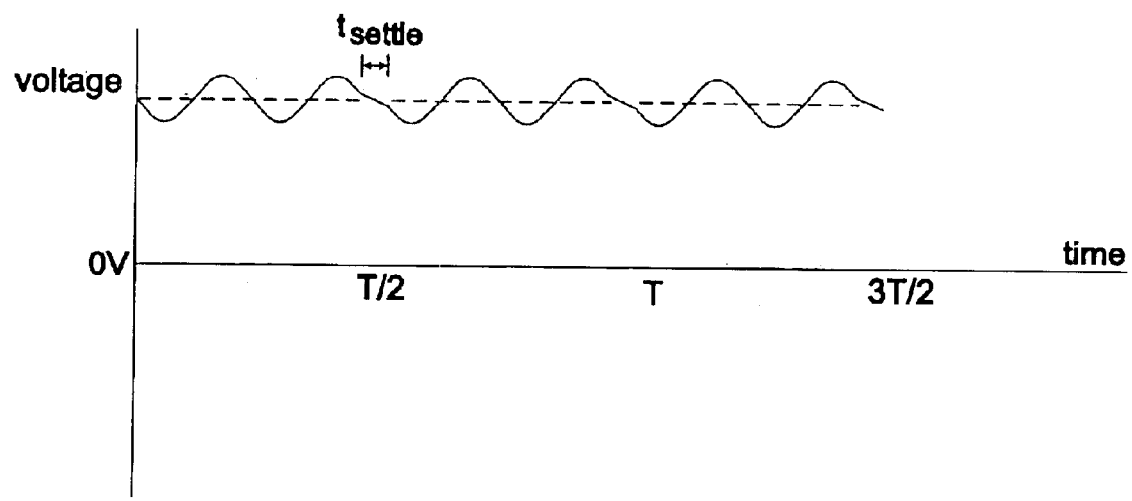
FIG. 6H is a drawing of even yet another wave form of a representative signal at a contact point of the RMS meter as described in various representative embodiments consistent with the teachings of the invention.

FIG. 6H is a drawing of even yet another wave form of a representative signal at a contact point of the RMS meter as described in various representative embodiments consistent with the teachings of the invention. The wave form shown in FIG. 6H is an analog representation of the digital signal at the output of the glitch remover circuit 140. Effectively the signal of FIG. 6H is the signal at the glitch remover circuit input 141 with the glitches created by the switching of the switch 120 removed. The signal at the output of the glitch remover circuit 140 can be generally expressed as $V_{142} = (V_{AC\_112} + V_{DC\_112})*linear(t)$ explicitly identifying the AC and DC components of the signal multiplied by a time varying linear interpolation function linear(t) which is approximately equal to $(V_{AC\_112} + V_{DC\_112})$ Notice that as the digital logic has knowledge of the times at which the switching occurs, it can isolate the time location of the switching glitches and linearly interpolate between points just before and just after the glitches. Such an interpolation will generally introduce very little error if the DC part of the signal at the absolute value circuit output 137 is much larger than the AC part of the signal and if the switching settling time $t_{settle}$ is much smaller than the switching period T.

Figure 6I:
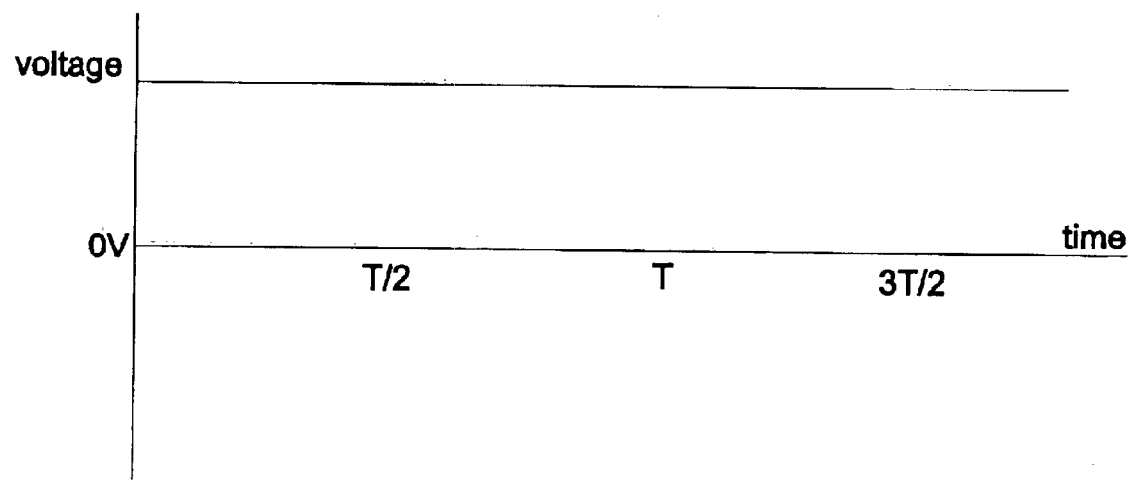
FIG. 6I is a drawing of even still another wave form of a representative signal at a contact point of the RMS meter as described in various representative embodiments consistent with the teachings of the invention.

FIG. 6I is a drawing of even still another wave form of a representative signal at a contact point of the RMS meter as described in various representative embodiments consistent with the teachings of the invention. The wave form shown in FIG. 6I is an analog representation of the digital signal at the output of the additional RMS conversion circuitry 145 which is the value of the signal at the conversion circuitry output 147. Effectively the signal of FIG. 6I is the root-mean-square of the signal at the conversion circuitry input 146. Additional RMS conversion circuitry 145 performs a second root-mean-square conversion of the signal at the conversion circuitry input 146 typically by digital signal processing. The root-mean-square converted signal is outputted at conversion circuitry output 147. The signal at the output of the additional RMS conversion circuitry 145 can be generally expressed as the RMS value $V_{147}$=square root of $[(V_{AC\_112})^2 + (V_{DC\_112})^2]$ which is approximately equal to the square root of $[(V_{AC\_111})^2 + (V_{DC\_111})^2]$. The inverting amplifier 115 and the switch 120 coupled with subsequent circuitry provides a technique for removal of the unstable offset $V_{OS}$ in the analog-to-digital converter 125.

Figure 7:
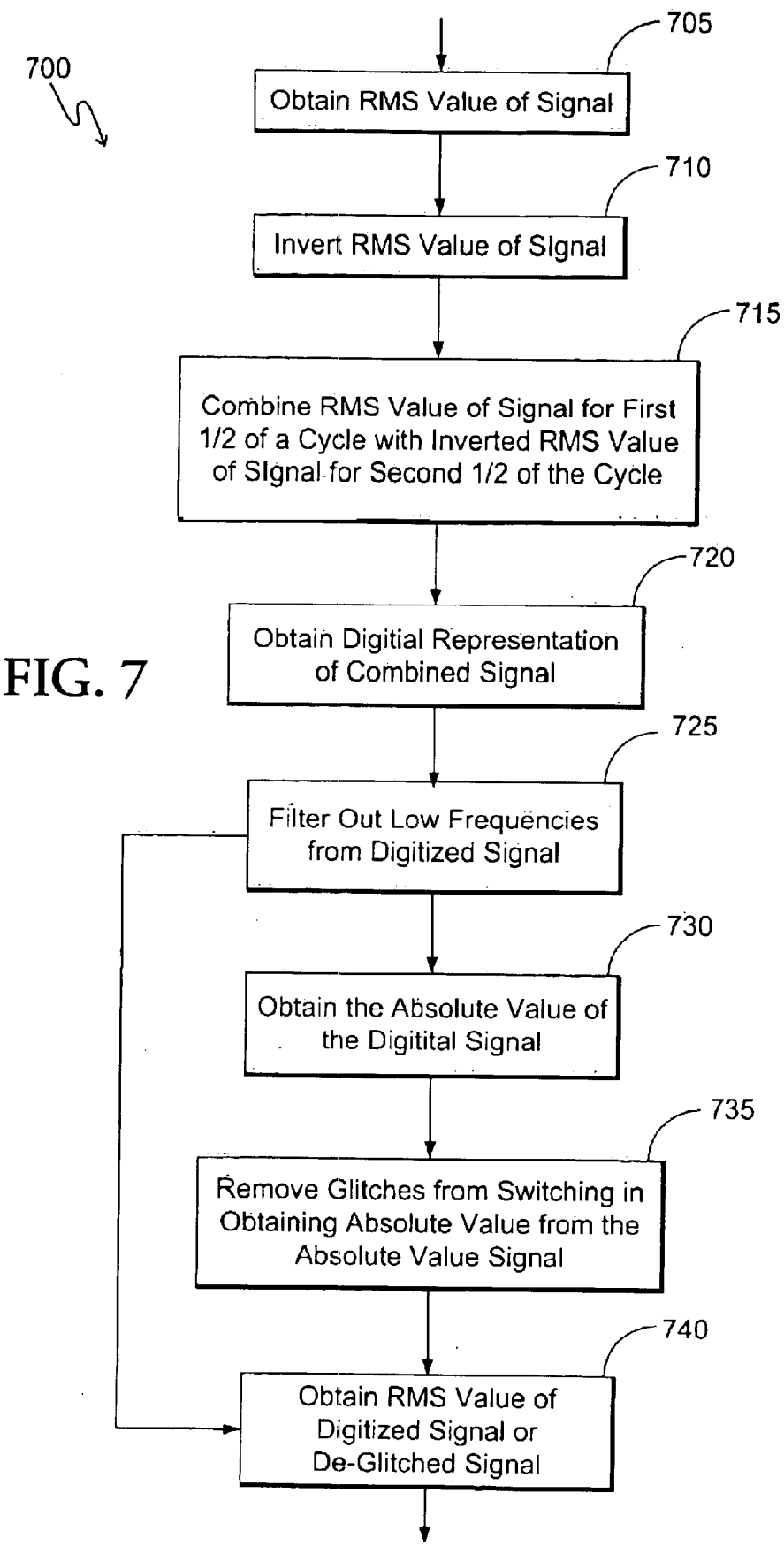
FIG. 7 is a drawing of a flow chart of a method for root-mean-square converter output signal processing as described in various representative embodiments consistent with the teachings of the invention.

FIG. 7 is a drawing of a flow chart of a method 700 for root-mean-square converter output signal processing as described in various representative embodiments consistent with the teachings of the invention. In block 705 of FIG. 7, the root-mean-square of the input signal is obtained. Block 705 then transfers control to block 710.

In block 710, an inverted signal of the root-mean-square of the input signal which was obtained in block 705 is obtained. Block 710 then transfers control to block 115.

In block 715, the root-mean-square signal obtained in block 705 and the inverted root-mean-square signal obtained in block 710 are combined by switching between the two signals with the first half of the duty cycle occupied by the root-mean-square signal and the second half of the duty cycle occupied by the inverted root-mean-square signal. Block 715 then transfers control to block 720.

In block 720, converts the analog signal obtained in block 715 into a digital representation. Block 720 then transfers control to block 725.

In block 725, low frequencies in the signal obtained in block 720 are filtered out. Block 725 then transfers control to block 730. However, blocks 730 and 735 may optionally be skipped with block 725 transferring control directly to block 740.

In block 730, the absolute value of the digital signal obtained in block 725 is obtained. Block 730 then transfers control to block 735.

In block 735, glitches introduced in block 715 by switching between the two signals are removed. Block 735 then transfers control to block 740.

If block 740 is reached via block 730, the root-mean-square value of the signal obtained in block 730 is obtained. Otherwise, block 740 obtains the root-mean-square value of the signal obtained in block 735. Block 740 then terminates the process.

As is the case, in many data-processing products, the RMS meter 100 may be implemented as a combination of hardware and software components. Moreover, at least parts of the functionality required may be embodied on program storage medium to be used in programming the RMS meter 100. The term "program storage medium" is broadly defined herein to include any kind of computer memory such as, but not limited to, floppy disks, conventional hard disks, DVD's, CD-ROM's, Flash ROM's, nonvolatile ROM, and RAM.

An advantage of the embodiments as described herein over prior devices is the ability to remove the unstable offset common in analog-to-digital converts without requiring the removal of the analog-to-digital converter 125 from the signal being measured in order to obtain a reading of the ground potential.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A root-mean-square (RMS) meter, comprising:
   an RMS converter having a converter input and a converter output, wherein the RMS converter converts a time varying signal applied to the converter input to a signal at the converter output, wherein the value of the signal at the converter output is indicative of the RMS value of the applied signal, and wherein the signal at the converter output comprises a non-time varying component and a time varying component as determined by a time constant of the RMS converter;
   an inverting amplifier having an inverter input and an inverter output, wherein the converter output is connected to the inverter input; and
   a switch having first, second, and central contacts, wherein the converter output is connected to the first contact, wherein the inverter output is connected to the second contact, wherein when the switch is in a first position, the first contact is connected to the central contact, and wherein when the switch is in a second position, the second contact is connected to the central contact.

2. The RMS meter as recited in claim 1, further comprising an analog-to-digital converter (ADC) having an ADC input and an ADC output, wherein the central contact is connected to the ADC input, wherein the central contact is alternately connected to the first contact and to the second contact, and wherein the analog-to-digital converter comprises an internal drifting offset signal.

3. The RMS meter as recited in claim 2, further comprising a high-pass filter having a filter input and a filter output, wherein the ADC output is connected to the filter input and wherein the high-pass filter removes substantially all of the internal drifting offset signal.

4. The RMS meter as recited in claim 3, further comprising an absolute value circuit having an absolute value circuit input and an absolute value circuit output, wherein the filter output is connected to the absolute value circuit input and wherein the signal at the absolute value circuit output is the absolute value of the absolute value circuit input.

5. The RMS meter as recited in claim 4, further comprising a glitch remover circuit having a glitch remover circuit input and a glitch remover circuit output, wherein the absolute value circuit output is connected to the glitch remover circuit input and wherein the glitch remover circuit removes signal disturbances in the signal at the glitch remover circuit input that were caused by transitions from the switch first position to the switch second position.

6. The RMS meter as recited in claim 5, further comprising additional RMS conversion circuitry having a conversion circuitry input and a conversion circuitry output, wherein the glitch remover circuit output is connected to the conversion circuitry input and wherein the additional RMS conversion circuitry converts the signal at the c on version circuitry in put to a signal at the conversion circuitry output that is representative of the RMS value of the signal at the c on version circuitry input.

7. The RMS meter as recited in claim 6, wherein the additional RMS conversion circuitry computes the signal at the conversion circuitry output from the signal at the conversion circuitry input by digital signal processing.

8. The RMS meter as recited in claim 3, further comprising additional RMS conversion circuitry having a conversion circuitry input and a conversion circuitry output, wherein the filter output is connected to the conversion circuitry input and wherein the additional RMS conversion circuitry converts the signal at the conversion circuitry input to a signal at the conversion circuitry output that is representative of the RMS value of the signal at the conversion circuitry input.

9. The RMS meter as recited in claim 8, wherein the additional RMS conversion circuitry computes the signal at the conversion circuitry output from the signal at the conversion circuitry input by digital signal processing.

10. A method for processing an input signal, comprising:
   obtaining a root-mean-square signal by taking the root-mean-square of the input signal;
   inverting the root-mean-square signal; and
   using equal duty cycles, combining the root-mean-square signal and the inverted root-mean-square signal by periodically switching between the two signals.

11. The method as recited in claim 10, further comprising:

converting the signal resulting from the step combining the root-mean-square signal and the inverted root-mean-square signal to a digital signal.

12. The method as recited in claim 11, further comprising:

removing frequency components below a preselected frequency from the signal resulting from the step converting the combined signal to a digital signal.

13. The method as recited in claim 12, further comprising:

obtaining the absolute value of the signal resulting from the step removing frequency components below the preselected frequency.

14. The method as recited in claim 13, further comprising:

removing glitches resulting from the step combining the root-mean-square signal and the inverted root-mean-square signal by periodically switching between the two signals from the signal resulting from the step obtaining the absolute value.

15. The method as recited in claim 14, further comprising:

obtaining the root-mean-square value of the signal resulting from the step removing glitches from the signal.

16. The method as recited in claim 15, providing the root-mean-square is obtained by digital signal processing in the step obtaining the root-mean-square value of the signal resulting from the step removing glitches from the signal.

17. The method as recited in claim 12, further comprising:

obtaining the root-mean-square value of the signal resulting from the step removing frequency components below the preselected frequency.

18. The method as recited in claim 17, providing the root-mean-square is obtained by digital signal processing in the step obtaining the root-mean-square value of the signal resulting from the step obtaining the absolute value of the signal.

* * * * *

UNITED STATES PATENT AND TRADEMARK OFFICE
CERTIFICATE OF CORRECTION

PATENT NO. : 6,765,516 B1
DATED : July 20, 2004
INVENTOR(S) : William H. Coley and Ronald L. Swerlein It is certified that error appears in the above-identified patent and that said Letters Patent is hereby corrected as shown below:

Column 10,
Line 38, after "signal at the", delete "c on version" and insert therefor -- conversion --
Line 39, after "circuitry", delete "in put" and insert therefor -- input --
Line 41, before "circuitry", delete "c on version" and insert therefor -- conversion --

Signed and Sealed this

Thirtieth Day of November, 2004

JON W. DUDAS
*Director of the United States Patent and Trademark Office*